(12) United States Patent
Saha et al.

(10) Patent No.: US 6,529,010 B1
(45) Date of Patent: Mar. 4, 2003

(54) LOCATION OF FAULT ON SERIES-COMPENSATED POWER TRANSMISSION LINES

(75) Inventors: Murari Saha, Vasteras (SE); Jan Izykowski, Wroclaw (PL); Eugeniusz Rosolowski, Wroclaw (PL); Bogdan Kasztenny, Wroclaw (PL)

(73) Assignee: ABB AB, Vasteras (SE)

( * ) Notice: Subject to any disclaimer, the term of this patent is extended or adjusted under 35 U.S.C. 154(b) by 0 days.

(21) Appl. No.: 09/582,087
(22) PCT Filed: Dec. 18, 1998
(86) PCT No.: PCT/SE98/02404
§ 371 (c)(1),
(2), (4) Date: Sep. 5, 2000
(87) PCT Pub. No.: WO99/32894
PCT Pub. Date: Jul. 1, 1999

(30) Foreign Application Priority Data

Dec. 22, 1997 (SE) ................................ 9704797

(51) Int. Cl.[7] .............................. G01R 31/00
(52) U.S. Cl. ................. 324/525; 324/521; 364/492
(58) Field of Search ................. 324/522–525, 324/509, 521; 702/59; 364/481, 483, 492

(56) References Cited

U.S. PATENT DOCUMENTS

| 4,325,098 A | 4/1982 | Heller |
| 4,559,491 A | 12/1985 | Saha |
| 5,455,776 A | 10/1995 | Novosel |

FOREIGN PATENT DOCUMENTS

EP 0 665 441 A2 8/1995

*Primary Examiner*—Michael Sherry
*Assistant Examiner*—Roshni Kurian
(74) *Attorney, Agent, or Firm*—Dykema Gossett, PLLC

(57) ABSTRACT

The present invention relates to a method for locating a fault on a power transmission line which is series-compensated with capacitors. The site of the fault is determined with the aid of measured currents and voltages at one of the two ends of the power transmission line before and after the occurrence of the fault and a calculating algorithm based on impedance models of the power transmission line before and after the occurrence of the fault.

12 Claims, 3 Drawing Sheets

LOCATION OF FAULT ON SERIES-COMPENSATED POWER TRANSMISSION LINES

TECHNICAL FIELD

The present invention forms an integral part of a protection system for power transmission lines which are series-compensated with capacitors. Specifically, the invention relates to a method and a device for locating a fault which has occurred on the power transmission line. The distance from a station, located at one end of the power transmission line, to the fault is determined with the aid of calculating algorithms based on impedance models of the power transmission line and voltages and currents measured at the station before and after the occurrence of the fault.

BACKGROUND ART, PROBLEMS

A method for fault location on a three-phase power transmission line is known from U.S. Pat. No. 4,559,491. The method for fault location on a three-phase power transmission line, described in U.S. Pat. No. 4,559,491, is based on an impedance model of the power transmission line. A condition for the method according to U.S. Pat. No. 4,559,491 is that the power transmission line has a linear impedance also when a fault has occurred. Series capacitors for phase compensation are normally provided with overvoltage protection devices in the form of some protection component with a non-linear characteristic in the area of interference and the method according to U.S. Pat. No. 4,559,491 is therefore not applicable to a three-phase power transmission line with series capacitors for phase compensation.

From U.S. Pat. No. 4,719,580 it is known that fault location on a three-phase power transmission line may be made according to method based on a waveguide model of the power transmission line. Fault location on a power transmission line with series capacitors for phase compensation based on a waveguide model of the power transmission line may, for certain types of faults, give a misleading result and this fault-location technique has therefore not been accepted by the users.

A method for fault location based on an impedance model of the power transmission line should take into consideration the fact that the occurrence of a fault on the monitored power transmission line entails the feeding of electric power from both ends of the power transmission line to the site of the fault in question since otherwise the fault location cannot be performed with sufficient accuracy. To obtain a result with satisfactory accuracy in the fault-position determination, fault location based on an impedance model of the power transmission line assumes that the power inputs from the two ends of the power transmission line are determined by measuring or calculating the two power inputs. From U.S. Pat. No. 5,455,776 it is known that fault location on a three-phase transmission line may be made with a method which assumes measurement of voltage and current at the two ends of the monitored transmission line. The method could be adapted to series-compensated transmission lines but has the disadvantage of being dependent on measured values from the two ends of the transmission line, which complicates the fault location and makes it more expensive compared with methods operating with measured values from one end of the transmission line only, normally the end of the transmission line where the fault location is arranged.

A method for fault location based on measurement at one end of the transmission line only is described in *IEEE Transaction on Power Apparatus and Systems,* Vol. PAS-104, No. 2, February 1985, pp. 424–436. This method assumes that the monitored part of the transmission line is described by a linear model and the method is thus not useful for series-compensated transmission lines with non-linear protection devices for protecting the capacitors against overvoltage.

SUMMARY OF THE INVENTION, ADVANTAGES

Figure 1:
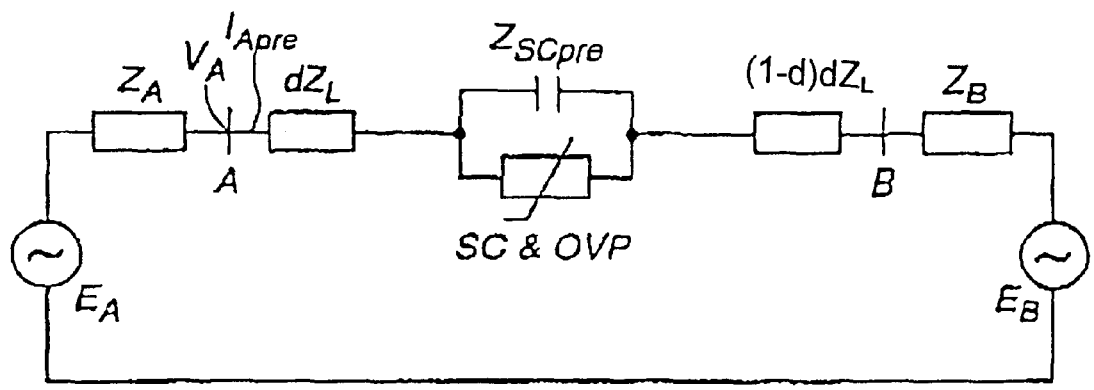
FIG. 1 shows an impedance model of a faultless power transmission line, series-compensated with capacitors with overvoltage protection device, between two stations A and B.

A single-line diagram for a faultless power transmission line, series-compensated with capacitors, between two stations A and B is shown in FIG. 1. In this context, the terms "backward" and "forward" are often used when referring to the location of a power network in relation to the power transmission line. A backward power network according to FIG. 1 is represented by an emf $E_A$ and an impedance $Z_A$. In a corresponding way, a forward network is represented by an emf $E_B$ and an impedance $Z_B$. Further, FIG. 1 shows $Z_L$ the impedance of the power transmission line d the distance in per unit from station A to the series capacitors $dZ_L$ the impedance of the power transmission line between station A and the series-compensated capacitors.

The capacitors in series-compensated power networks are normally provided with a parallel-connected overvoltage protection device. The parallel connection will be referred to below as "SC&OVP" and is represented by a non-linear impedance because of the non-linear current/voltage characteristic of the overvoltage protection device.

$Z_{SC}$ non-linear impedance consisting of the series capacitors and their overvoltage protection devices $(1-d)dZ_L$ the impedance of the power transmission line between SC&OVP and station B.

The faultless power transmission line, that is, prior to the occurrence of a fault, may thus, according to FIG. 1, be described, in matrix form, by the equation $$E_A - E_B = [Z_A + Z_B + Z_L + Z_{SC\_pre}]I_{A\_pre} \quad (1)$$

The index "pre" implies that the value of the quantity in question is the value prior to the occurrence of a fault. In the following description, equations with quantities with the index "post" will also be described, which, in a corresponding manner, implies that the value of the quantity in question is the value after the occurrence of a fault. A condition for the distance-to-fault calculation is thus that a continuous measurement and storage of a number of consecutively measured voltage and current values is performed.

As regards the post-fault situation, it must be distinguished whether the fault is located between station A and SC&OVP or if the fault is located between SC&OVP and station B.

Figure 2:
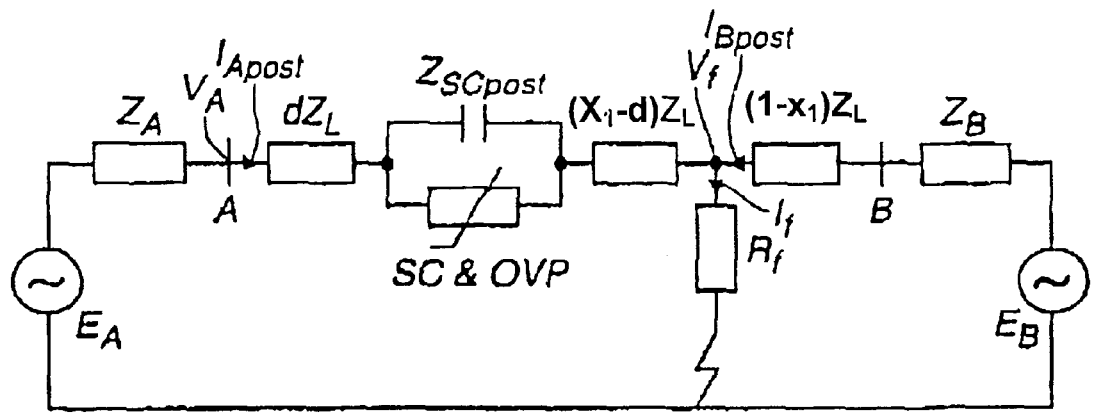
FIG. 2 shows an impedance model of the same power transmission line when a fault has occurred between the series capacitors and station B.

FIG. 2 shows an impedance model of a series-compensated power transmission line when a fault has occurred between SC&OVP and station B. A fault which has occurred within this area will be referred to below as a fault 1. The impedance model according to FIG. 2 may, in matrix form, be described with the equation $$E_A - E_B = [Z_A + x_1 Z_L + Z_{SC\_post}]I_{A\_post} - [(1-x_1)Z_L + Z_B]I_{B\_post} \quad (2)$$

where $x_1$ designates the distance from the end point A of the monitored power transmission line to the fault.

Figure 3:
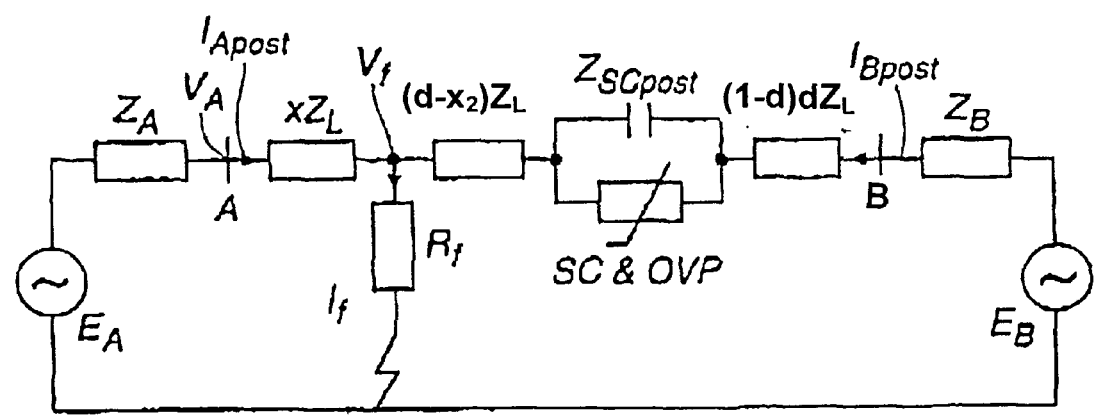
FIG. 3 shows an impedance model of the same power transmission line when a fault has occurred between station A and the series capacitors.

FIG. 3 shows an impedance model and a series-compensated power transmission line when a fault has occurred between station A and SC&OVP. A fault which has occurred within this area will be referred to below as a fault 2. The impedance model according to FIG. 3 may, in matrix form, be described with the equation $$E_A - E_B = [Z_A + x_2 Z_L]I_{A\_post} - [(1-x_2)Z_L + Z_B + Z_{SC\_post}]I_{B\_post} \quad (3)$$

Figure 4:
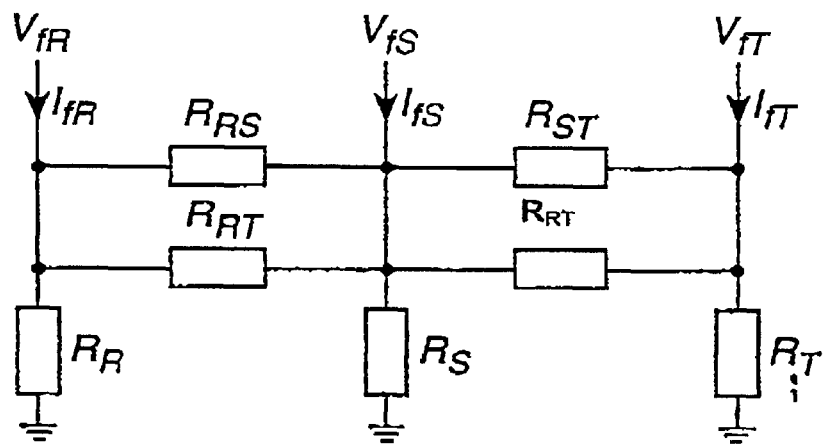
FIG. 4 shows possible fault configurations on the power transmission line.

In FIGS. 2 and 3, the fault is represented by a fault resistance $R_f$ to ground or zero. A fault on a three-phase line R, S and T may occur in a plurality of different ways. FIG. 4 shows how a fault with a fault resistance $R_R$, $R_S$ and $R_T$ may occur between any of the phases and ground and as $R_{RS}$, $R_{ST}$ etc. between different phases. A combination of the individual cases may also occur. The voltage at the fault site is defined as $V_{fR}$, $V_{fS}$ and $V_{fT}$ and the corresponding currents as $I_{fR}$, $I_{fS}$ and $I_{fT}$.

To be able to distinguish the different types of fault that may occur, the distance-to-fault calculation makes use of a fault-type matrix which has the general form $$K_f = \begin{bmatrix} k_{RR} & k_{SR} & k_{TR} \\ k_{RS} & k_{SS} & k_{TS} \\ k_{RT} & k_{ST} & k_{TT} \end{bmatrix}$$

The elements in $K_f$ are determined in dependence on the type of fault as follows:
- non-diagonal elements are given the value 0 if the phase in question is not concerned by the relevant fault and the value −1 if the phase is concerned by the relevant fault
- The diagonal elements are given the value 1 if the phase in question has a fault to ground at the fault in question and to this is added the sum of the absolute values of the non-diagonal elements in the relevant line.

A few examples of a filled-in matrix $K_f$ for some typical types of fault are shown below $$K_f = \begin{bmatrix} 1 & 0 & 0 \\ 0 & 0 & 0 \\ 0 & 0 & 0 \end{bmatrix} \text{ for fault R-ground}$$

$$K_f = \begin{bmatrix} 2 & -1 & -1 \\ -1 & 2 & -1 \\ -1 & -1 & 2 \end{bmatrix} \text{ for fault R-S-T}$$

$$K_f = \begin{bmatrix} 3 & -1 & -1 \\ -1 & 3 & -1 \\ -1 & -1 & 3 \end{bmatrix} \text{ for fault R-S-T-ground}$$

$$K_f = \begin{bmatrix} 1 & -1 & 0 \\ -1 & 1 & 0 \\ 0 & 0 & 0 \end{bmatrix} \text{ for fault R-S}$$

$$K_f = \begin{bmatrix} 2 & -1 & 0 \\ -1 & 2 & 0 \\ 0 & 0 & 0 \end{bmatrix} \text{ for fault R-S-ground}$$

The vectorial relationship between the fault current $I_f$, i.e. $I_{fR}$, $I_{fS}$ and $I_{fT}$, the fault voltage $V_f$, i.e. $V_{fR}$, $V_{fS}$ and $V_{fT}$, the equivalent fault resistance $R_f$ and the fault matrix is clear from the equation $$I_f = K_f V_f / R_f \quad (4)$$

Figures 5, 6:
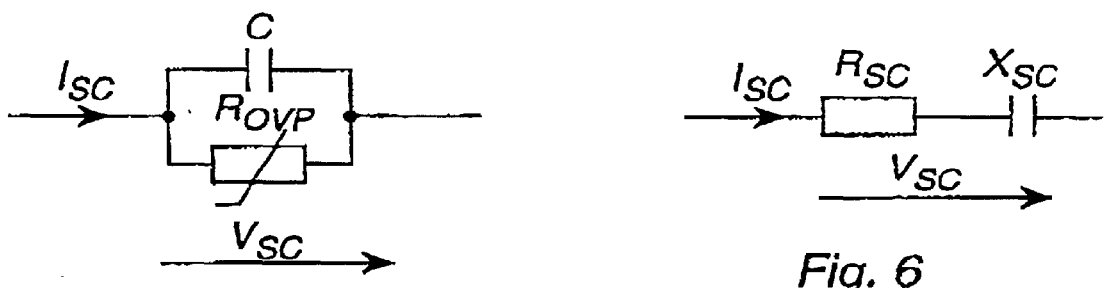
FIGS. 5 and 6 show how the parallel connection of the series capacitors and the overvoltage protection device may be replaced by a model-equivalent impedance consisting of a series connection of a resistance and a reactance.

In connection with the calculation of the distance to the fault (hereinafter referred to as the distance-to-fault calculation) which is described below, knowledge of $Z_{SC}$ is needed, that is, the value of the non-linear impedance as a function of the actual current flowing through the impedance. One way of determining $Z_{SC}$ is to transform the parallel connection according to FIG. 5 into a model-equivalent impedance according to FIG. 6 in the form of a series connection of a resistance $R_{SC}$ and a reactance $X_{SC}$. By, for example, a transient test, $R_{SC}$ and $X_{SC}$ may be determined individually as functions of a traversing current $I_{SC}$, according to FIG. 7, or in the form of a corresponding analytic function. This implies that, when the current through $Z_{SC}$ is known, $Z_{SC}$ may be determined as $$Z_{SC} = R_{SC} + jX_{SC} \quad (5)$$

In the case of a fault 1 according to FIG. 2 and equations (2), both $R_{SC}$ and $X_{SC}$, i.e. $Z_{SC}$, can be determined with the current $I_A$ measured in station A.

In case of a fault 2 according to FIG. 3 and equation (3), however, it is the unknown current $I_B$ which traverses $Z_{SC}$. It is, therefore, an integral part of the invention to obtain a measure of the current $I_B$ by means of an iterative process. This current is then calculated by means of equation (6) with an assumption of $Z_{SC}$ and the distance $x_2$.

$$I_B = ((1-x_2)Z_L + Z_B + Z_{SC})^{-1} \cdot ((Z_A + x_2 Z_L)I_A - (E_A - E_B)) \quad (6)$$

The value of $I_B$ thus obtained determines, in its turn, a preliminary value of $Z_{SC}$ in the same way as above and will be used in the calculating algorithm which will be described below for the distance-to-fault calculation.

The calculating algorithms according to the invention which calculate the distances from station A to the fault are based on the impedance models related above and corresponding equations in matrix form. Since the impedance models are different depending on whether the fault is located between SC&OVP and station B or between station A and SC&OVP, also the calculating algorithms will be different.

The calculating algorithm for calculating a fault 1, that is, calculating the distance from station A to a fault which is located between SC&OVP and station B, consists of the equations $$E_A - E_B = [Z_A + Z_B + Z_L + Z_{SC\_pre}]I_{A\_pre} \quad (1)$$

$$E_A - E_B = [Z_A + x_1 Z_L + Z_{SC\_post}]I_{A\_post} - [(1-x_1)Z_L + Z_B]I_{B\_post} \quad (2)$$

$$V_{A\_post} - V_f = (x_1 Z_L + Z_{SC\_post})I_{A\_post} \quad (7)$$

$$I_f = I_{A\_post} + I_{B\_post} \quad (8)$$

where $x_1$ designates the unknown distance from the end point A of the monitored transmission line to the site of the fault, and $V_f$ is obtained by means of equation (4).

If (1) is combined with (2, 4, 7, 8), a first distance-to-fault equation is obtained, after simplification, according to the following scalar quadratic equation $$\underline{a}_1 x_1^2 - \underline{b}_1 x_1 + \underline{c}_1 - R_{f1} = 0 \quad (9)$$

where $\underline{a}_1$, $\underline{b}_1$ and $\underline{c}_1$ designate complex coefficients. By means of a first auxiliary vector $$D_1 = (Z_A + Z_B + Z_L)(I_{A\_post} - I_{A\_pre}) + Z_{SC\_post} I_{A\_post} - Z_{SC\_pre} I_{A\_pre} \quad (10)$$

and $D_1^T$ which designates the transpose matrix of $D_1$

The coefficients $a_1$, $b_1$ and $c_1$ may be calculated as follows $$\underline{a}_1 = \frac{D_1^T}{D_1^T D_1} Z_L K_f Z_L I_{A\_post} \quad (11)$$

$$\underline{b}_1 = \frac{D_1^T}{D_1^T D_1}(Z_L K_f [V_{A\_post} + (Z_L - Z_{SC\_post})I_{A\_post}] + Z_B K_f Z_L I_{A\_post}) \quad (12)$$

$$\underline{c}_1 = \frac{D_1^T}{D_1^T D_1}(Z_L + Z_B)(V_{A\_post} - Z_{SC\_post} I_{A\_post})K_f \quad (13)$$

The first distance-to-fault equation is solved by means of an iterative process which is to be described in greater detail below. of the two solutions of the quadratic equation, only one gives a practical solution, namely a distance to fault equal to $$x_{11} = \frac{Im(\underline{b}_1) - \sqrt{Im(\underline{b}_1)Im(\underline{b}_1) - 4Im(\underline{a}_1)Im(\underline{c}_1)}}{2Im(\underline{a}_1)} \quad (14)$$

where $Im(a_1)$, $Im(b_1)$ och $Im(c_1)$ are equal to the imaginary part of the coefficients.

It has been found out that the second root of the distance-to-fault equation (9) gives unreasonable values of the distance to the fault and that the equation (14) therefore represents a sought solution to the first distance-to-fault equation (9).

By inserting the obtained value $x_{11}$ into the first distance-to-fault equation (9), a corresponding fault resistance $R_{f1}$ is obtained by the relationship $$R_{f1} = Re(\underline{a}_1)x_{11}^2 - Re(\underline{b}_1)x_{11} + Re(\underline{c}_1) \quad (15)$$

where $Re(a_1)$, $Re(b_1)$ and $Re(c_1)$ are equal to the real part of the coefficients.

Determination of distance to fault and fault resistance is made by an iterative process which will be described below.

The calculating algorithm for the distance-to-fault calculation in case of fault 2 consists of the following equation system:

$$E_A - E_B = [Z_A + Z_B + Z_L + Z_{SC\_pre}]I_{A\_pre} \quad (1)$$

$$E_A - E_B = [Z_A + x_2 Z_L]I_{A\_post} - [(1-x_2)Z_L + Z_B + Z_{SC\_post}]I_{B\_post} \quad (3)$$

$$V_{A\_post} - V_1 = x_2 Z_L I_{A\_post} \quad (16)$$

$$I_f = I_{A\_post} + I_{B\_post} \quad (17)$$

where $x_2$ designates the unknown distance from the end point A of the monitored transmission line to the site of the fault, and $V_f$ is obtained by means of equation (4). If (1) is combined with (3, 5, 16, 17), a second distance-to-fault equation is obtained, after simplification, according to the following scalar quadratic equation with $x_2$ as variable $$\underline{a}_2 x_2^2 - \underline{b}_2 x_2 + \underline{c}_2 - R_{f2} = 0 \quad (18)$$

where $\underline{a}_2$, $\underline{b}_2$ and $\underline{c}_2$ designate complex coefficients. By means of a second auxiliary vector $$D_2 = (Z_A + Z_B + Z_L)(I_{A\_post} - I_{A\_pre}) + Z_{SC\_post} I_{A\_post} - Z_{SC\_pre} I_{A\_pre} \quad (19)$$

and $D_2^T$ which designates the transpose matrix of $D_2$

The coefficients $a_2$, $b_2$ and $c_2$ may be calculated as follows:

$$\underline{a}_2 = \frac{D_2^T}{D_2^T D_2} Z_L K_f Z_L I_{A\_post} \quad (20)$$

$$\underline{b}_2 = \frac{D_2^T}{D_2^T D_2}(Z_L K_f V_{A\_post} + [Z_L + Z_{SC\_post} + Z_B] K_f Z_L I_{A\_post}) \quad (21)$$

$$\underline{c}_2 = \frac{D_2^T}{D_2^T D_2}(Z_L + Z_B + Z_{SC\_post}) K_f V_{A\_post} \quad (22)$$

The solution to the second distance-to-fault equation (16) gives a sought distance to the site of the fault as $$x_{21} = \frac{Im(\underline{b}_2) - \sqrt{Im(\underline{b}_2)Im(\underline{b}_2) - 4Im(\underline{a}_2)Im(\underline{c}_2)}}{2Im(\underline{a}_2)} \quad (23)$$

It has been found out that the second root of the distance-to-fault equation (18) gives unreasonable values of the distance to the fault and that the equation (23) therefore represents a sought solution to the first distance-to-fault equation (18).

By inserting the obtained value $x_{21}$ into the second distance-to-fault equation (18), the corresponding fault resistance $R_{f2}$ is obtained by the relationship $$R_{f2} = Re(\underline{a}_2)x_{21}^2 - Re(\underline{b}_2)x_{21} + Re(\underline{c}_2) \quad (24)$$

Determination of distance to fault and fault resistance is made by an iterative process which will be described below.

Before the iterative process for calculating the distance to fault can be started, a number of conditions must be fulfilled:

Independently of whether the fault is a category 1 fault or a category 2 fault, information about the value of fixed parameters, included in the equation systems, must be available. This relates to values of the backward and forward power networks, the length of the power transmission line, the impedance, the distance from station A to the series capacitors, and so on.

An assumption must be made on an initial value of distance to fault and fault resistance. This assumption may be made with arbitrary values within permissible limits.

When a fault has occurred, the type of fault and hence also the $K_f$ matrix may be determined.

To be able to determine which of the calculating algorithms is to be used, knowledge must be gained as to on which side of SC&OVP the fault has occurred, that is, whether it is a fault 1 or a fault 2.

There must be a continuous access, both before and after a fault has occurred, of filtered values of current and voltage measured in one of the stations (A).

After the above conditions have been fulfilled, the distance-to-fault calculation is initiated.

Figure 7:
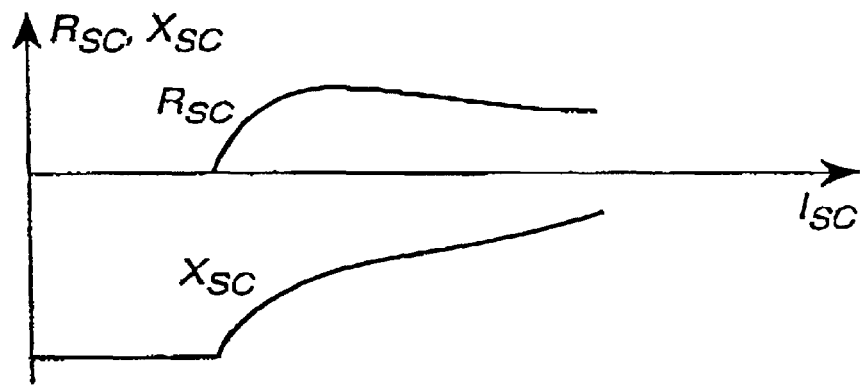
FIG. 7 shows how the parameters of the model equivalent as a function of a current, passing through the impedance, may be determined.

In case of a fault 1, the following occurs:

Based on the current $I_A$ measured in station A after the occurrence of the fault, $R_{SC}$ and $X_{SC}$ are determined, for example with FIG. 7, whereupon $Z_{SC}$ in equation (2) may be determined.

- the $D_1$ auxiliary vectors are calculated according to equation (10)
- the coefficients $a_1$, $b_1$ and $c_1$ for the first distance-to-fault equation (9) are calculated according to equations (11), (12) and (13)
- a first calculated value of the distance to the fault is calculated according to equation (14), and
- a first value of the fault resistance is calculated according to equation (15).

The first calculated value of the distance to the fault is compared with the assumed value of the distance to the fault. If the difference between the values is greater than a pre-set maximally permissible difference value $S_1$, the assumed value in equations (2) and (7) is replaced by the first calculated value of the distance to the fault and the fault resistance.

Thereafter, a new calculation procedure is carried out according to the above, which provides new values of the distance to the fault and the fault resistance. If the difference between the last calculated value of the distance to the fault and the first calculated value is greater than the maximally permissible difference value, the first calculated value in equations (2) and (7) is replaced by the last calculated values of the distance to fault and the fault resistance.

This iteration continues until the difference value of two consecutive calculation procedures is smaller than the set maximally permissible difference value, whereupon the last calculated values of the distance to fault and the fault resistance are regarded as the real values.

In case of a fault 2, the following occurs:

Based on the current $I_A$ measured in station A and an assumption of $Z_{SC}$, after the occurrence of the fault, a preliminary value of the current through $Z_{SC}$ is calculated by means of equation (5). By means of the preliminary value of the current, a first value of $R_{SC}$ and $X_{SC}$, that is also $Z_{SC}$, may be obtained. The first calculated values are compared with the assumed value of $Z_{SC}$. If the difference between the values is greater than a preset maximally permissible difference value $S_2$, the set value in equation (6) is replaced by the first calculated value of $Z_{SC}$. This iteration continues until the difference value of two consecutive calculation procedures is smaller than the set maximally permissible difference value, whereupon the last calculated value of $Z_{SC}$ constitutes the assumption of $Z_{SC}$ which is needed in equations (3) and (16).

- the $D_2$ auxiliary vectors are calculated according to equation (19)
- the coefficients $a_2$, $b_2$ and $c_2$ of the second distance-to-fault equation (18) are calculated according to equations (20), (21) and (22)
- a first calculated value of the distance to the fault is calculated according to equation (23), and
- a first value of the fault resistance is calculated according to equation (22).

The first calculated value of the distance to the fault is compared with the set value of the distance to the fault. If the difference between the values is greater than a pre-set maximally permissible difference value $S_3$, the set value in equations (3) and (16) is replaced by the first calculated value of the distance to the fault and the fault resistance.

Thereafter, a new calculation procedure is carried out according to the above, which provides new values of the distance to the fault and the fault resistance. If the difference between the last calculated value of the distance to the fault and the first calculated value is greater than the maximally permissible difference value, the first calculated value in equations (3) and (16) is replaced by the last calculated values of the distance to fault and the fault resistance.

This iteration continues until the difference value of two consecutive calculation procedures is smaller than the set maximally permissible difference value, whereupon the last calculated values of the distance to fault and the fault resistance are regarded as the real values.

With access to the calculated values of the distances to fault, $x_{11}$ and $x_{21}$, and the corresponding fault resistances $R_{f1}$ and $R_{f2}$ and the equations described in the description, there is, according to the invention, a method for determining which of the distance-to-fault values represents the actual distance to the fault. The method is different depending on whether the fault is a three-phase fault or if it is an unsymmetrical fault, that is, if one or more phases is/are faultless.

If the fault is a three-phase fault, the following occurs:

Is $R_{f1} > R_{f2}$? Yes

If the answer is yes, it is assumed, as a first assumption, that the fault is a fault 2 and it is asked whether $R_{f2} > R_0$? where $R_0$ is a preset minimum value. If the answer is yes, the fault is a fault 2, that is, the calculated value of $x_{21}$ is the true value of the distance to the fault. If the answer is no, it is a fault 1, that is, the calculated value of $x_{11}$ is the true value of the distance to the fault.

Is $R_{f1} > R_{f2}$? No

If the answer is no, it is assumed, as a first assumption, that the fault is a fault 1 and it is asked whether $R_{f1} > R_0$? where $R_0$ is a preset minimum value. If the answer is yes, the fault is a fault 1, that is, the calculated value of $x_1$ is the true value of the distance to the fault. If the answer is no, it is a fault 2, that is, the calculated value of $x_{21}$ is the true value of the distance to the fault.

If the fault is an unsymmetrical fault, the currents through the fault resistances must first be determined for the two cases of fault.

For fault 1, the phase currents through the fault resistance may be determined with the aid of $$i_{f(R,S,T)1} = i_{A(R,S,T)} + i_{B(R,S,T)1} \qquad (25)$$

where $i_{A(R,S,T)}$ are the phase currents measured in station A $i_{B(R,S,T)1}$ is determined with the aid of equation (2) ($i_B = I_{a\text{-}post}$)

and for fault 2, the phase currents through the fault resistance may be determined with the aid of $$i_{f(R,S,T)2} = i_{A(R,S,T)} + i_{B(R,S,T)2} \qquad (26)$$

where $i_{B(R,S,T)2}$ is determined with the aid of equation (3) ($i_B = I_{B\text{-}post}$)

The method for determining whether it is a question of a fault 1 or a fault 2 comprises, after a faultless phase has been identified in conventional manner, first determining the currents at the site of the fault in the faultless phase or phases for the two cases of fault according to equations (25), (2) and (26), (3), that is $i_{f1}$ och $i_{f2}$. Then follows the following procedure:

Is $i_{f1}>i_{f2}$?

Now, if $i_{f1}>i_{f2}$ it is considered, as a first assumption, that the fault is a fault 2 and if $i_{f1}<i_{f2}$ fit is considered, as a first assumption, that the fault is a fault 1.

The continued determination procedure is exactly identical with the procedure when the fault is a three-phase fault, that is: In case of a fault 2, it is asked whether $R_{f2}>R_0$? where $R_0$ is a preset minimum value. If the answer is yes, the fault is a fault 2, that is, the calculated value of $x_{21}$ is the true value of the distance to the fault. If the answer is no, it is a fault 1, that is, the calculated value of $x_{11}$ is the true value of the distance to the fault.

In case of a fault 1, it is asked whether $R_{f1}>R_0$? where $R_0$ is a preset minimum value. If the answer is yes, the fault is a fault 1, that is, the calculated value of $x_{11}$ is the true value of the distance to the fault. If the answer is no, it is a fault 2, that is, the calculated value of $x_{21}$ is the true value of the distance to the fault.

DESCRIPTION OF THE PREFERRED EMBODIMENTS

Figure 8:
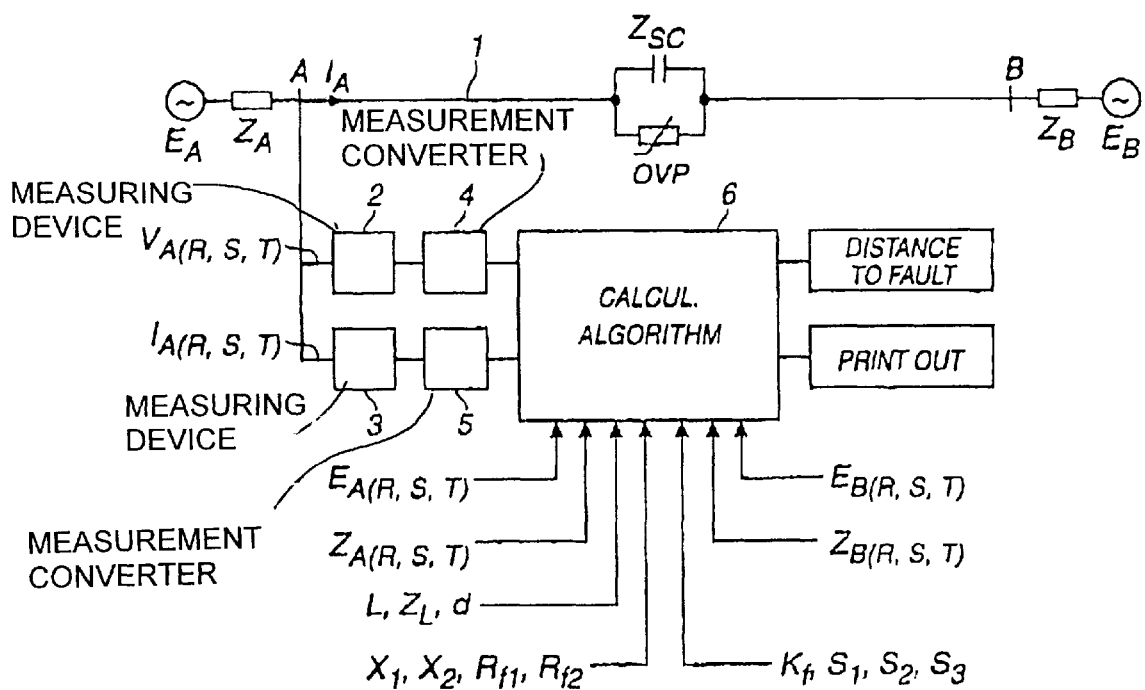
FIG. 8 shows how a device for carrying out the method may be designed.

A device for determining the distance from a station, at one end of a transmission line, until the occurrence of a fault on the transmission line according to the described method comprises certain measuring devices, measurement value converters, members for iterative treatment of the calculating algorithms of the method, a possibility of inputting to the member known conditions regarding the parameters of the power networks and assumed values of distance to fault, fault resistance, etc., a VDU indicating the calculated distance to fault, and a printer for printout of the calculated distance to fault. FIG. 8 largely shows an embodiment of the device. Embodiments similar to those of FIG. 8 are within the scope of the invention.

FIG. 8 shows a transmission line 1 between two stations A and B. The line is provided with capacitors, protecting against overvoltages, forming the impedance $Z_{SC}$. Station A accommodates measuring devices 2 and 3 for continuous measurement of all the phase currents and phase voltages. In the measurement converters 4 and 5, a number of these consecutively measured values, which in case of a fault are passed to a calculating unit 6, are filtered and stored. The calculating unit is provided with the calculating algorithms described, programmed for the iterative processes which are needed for calculating the distance to fault and the fault resistance.

Even before a fault occurred on the transmission line, the calculating unit was provided with a number of conditions and assumptions to be able to perform the calculation of the distance to fault etc. These conditions comprise values of the emf and the impedance of both a forward and a backward power network. The calculating unit is also supplied with known values of the length and impedance of the transmission line, the distance from station A to the series capacitors, set values of the distance to fault, the fault resistance, $Z_{SC}$ and the maximally permissible difference values $S_1$, $S_2$ and $S_3$. In connection with the occurrence of a fault, information about the type of fault may be supplied to the calculating unit for determining the fault-type matrix $K_f$. In addition, after the occurrence of the fault, information is supplied as to whether the fault is positioned between the series capacitors and station B or whether the fault is positioned between station A and the series capacitors, that is, whether the fault is a fault 1 or a fault 2.

Then, when a fault has occurred, and the external conditions are fulfilled, the calculating procedure starts with the necessary iterations to obtain difference values which fall below the maximally permissible ones. The finally calculated values will then be transferred to a VDU which shows the distance to the fault and the magnitude of the fault resistance, respectively, for further actions. The device also comprises possibilities for printout of the result.

In the similar embodiments indicated above, parts of the embodiment according to FIG. 8 may be more or less integrated in the calculating unit.

What is claimed is:

1. A method for location of a fault, and determination of a resultant fault resistance, occurring on a power transmission line which is series-compensated with capacitors, with a parallel-connected overvoltage protection device, between two stations (A) and (B), wherein distance to the fault from station (A) and the fault resistance are determined by means of values measured in station (A) of a voltage before (pre) and a voltage and a current after (post) the occurrence of the fault, wherein, if the fault occurred between the series capacitors and station B, the distance to the fault is determined by the steps of:

solving the expression:

$$x_{11} = \frac{Im(\underline{b}_1) - \sqrt{Im(\underline{b}_1)Im(\underline{b}_1) - 4Im(\underline{a}_1)Im(\underline{c}_1)}}{2Im(\underline{a}_1)}$$

which represents a first distance-to-fault equation;

solving the expression:

$$a_1 x_1^2 - b_1 x_1 + c_1 - R_{f1} = 0$$

for $\underline{a}$, $\underline{b}$ and $\underline{c}$, where $a_1$, $b_1$ and $c_1$ designate complex coefficients and $x_1$ represents the distance to the fault, and employing a first auxiliary vector $$D_1 = (Z_A + Z_B + Z_L)(I_{A\_post} I_{A\_pre}) + Z_{SC\_post} I_{A\_post} - Z_{SC\_pre} I_{A\_pre}$$

Or where $Z_A$ is a source impedance of a backward power network;

$Z_B$ is a source impedance of a forward power network;

$Z_L$ is an impedance of a power transmission line;

Index, Post identifies a value after the occurrence of a fault;

Index, Pre identifies a value before the occurrence of the fault;

$I_A$ is a fault current;

$Z_S$ is a complex impedance; and $D_1^T$, which designates a transpose matrix of $D_1$, calculating $\underline{a}$, $\underline{b}$ and $\underline{c}$ as follows:

$$\underline{a}_1 = \frac{D_1^T}{D_1^T D_1} Z_L K_f Z_L I_{A\_post}$$

$$\underline{b}_1 = \frac{D_1^T}{D_1^T D_1}(Z_L K_f [V_{A\_post} + (Z_L - Z_{SC\_post})I_{A\_post}] + Z_B K_f Z_L I_{A\_post}) \quad (12)$$

-continued $$c_1 = \frac{D_1^T}{D_1^T D_1}(Z_L + Z_B)(V_{A\_post} - Z_{SC\_post} I_{A\_post})K_f \quad (13)$$

and where $Im(a_1)$, $Im(b_1)$ and $Im(c_1)$ are an imaginary part of the complex coefficients a, $b_1$ and c, respectively, and the fault resistance equals $$R_{f1} = Re(\underline{a}_1)x_{11}^2 - Re(\underline{b}_1)x_{11} + Re(\underline{c}_1)$$

where $Re(a_1)$, $Re(b_1)$ and $Re(c_1)$ are a real part of the coefficients $\underline{a}_1$, $\underline{b}_1$ and $\underline{c}_1$.

2. A method for location of a fault, and determination of the resultant fault resistance, which has occurred on a series-compensated power transmission line according to claim 1, wherein:

$E_{A(R,S,R)}$ is the emf of the backward power network $Z_{A(R,S,T)}$ is the source impedances of the backward power network;

$E_{B(R,S,T)}$ is the emf of the forward power network;

$Z_{B(R,S,T)}$ is the source impedances of the forward power network;

$Z_L$ is the impedance of the power transmission line;

d is the distance in per unit from station A up to the series capacitor;

$dZ_L$ is the impedance of the power transmission line between station A and the series-compensated capacitor; and $(1-d)dZ_L$ is the impedance of the power transmission line between the series capacitor and station B.

3. A method for location of a fault, and determination of the resultant fault resistance, which has occurred on a series-compensated power transmission line according to claim 1, wherein, when a fault has occurred, in order to characterize which type of fault has occurred, determining a fault-type matrix $$K_f = \begin{bmatrix} k_{RR} & k_{SR} & k_{TR} \\ k_{RS} & k_{SS} & k_{TS} \\ k_{RT} & k_{ST} & k_{TT} \end{bmatrix}$$

according to the steps of:
determinism elements $k_{RR} \ldots k_{TT}$ in $K_f$ depending on the type of fault according to a procedure wherein,
non-diagonal elements are given the value 0 if the phase in question is not concerned with the relevant fault and the value −1 if the phase is concerned with the relevant fault; and
The diagonal elements are given the value 1 if the phase in question has a fault to ground at the fault in question and adding the sum of the absolute values of the non-diagonal elements in the relevant row.

4. A method for location of a fault, and determination of the resultant fault resistance, which has occurred on a series-compensated power transmission line according to claim 1, wherein a parallel connection of the series capacitors and the overvoltage protection device comprises a non-linear impedance $Z_{SC}$ represented by a model equivalent impedance in the form of a series connection of a resistance $R_{SC}$ and a reactance $X_{SC}$, individually determining the reactance and resistance as a function of a traversing current, determining an actual value of resistance and reactance, employing actual current which, after the occurrence of the fault, flows through the impedance, such that a non-lineat impedance is set as $Z_{SC} = R_{SC} + jX_{SC}$.

5. A method for location of a fault, and determination of a resultant fault resistance, which has occurred on a series-compensated power transmission line according to claim 4, wherein, if the fault occurred between the series capacitors and station B, measuring the actual current in station A for determining the non-linear impedance.

6. A method for location of a fault, and determination of a resultant fault resistance, which has occurred on a series-compensated power transmission line according to claim 5, wherein, if the fault occurred between station A and the series capacitors, an actual current $I_B$ is used for determining the non-linear impedance said current $I_B$ calculated in station B according to:

$$I_B = ((1-x_2)Z_L + Z_B + Z_{SC})^{-1} \cdot ((Z_A + x_2 Z_L)I_A - (E_A - E_B))$$

a value for assuming the non-linear impedance $Z_{SC}$ and the distance to fault $x_2$, which current is used for determining a new value of $Z_{SC}$ which is compared with the assumed value of $Z_{SC}$, and if the difference between the assumed value of $Z_{SC}$ and the new value is greater than a maximally permissible difference value $S_2$, the assumed value in $I_B$ is replaced by the first calculated value of $Z_{SC}$, repeating the previous calculation until the difference value of two consecutive calculating procedures is smaller than a maximum permissible difference value, whereupon a last obtained value of $Z_{SC}$ constitutes an assumed value which is employed for a final determination of the distance to fault and the fault resistance.

7. A method for location of a fault, and determination of the resultant fault resistance, which has occurred on a series-compensated power transmission line according to claim 1, wherein an assumption is made on a distance to fault "x" from station A and a fault resistance $R_f$.

8. A method for location of a fault, and determination of the resultant fault resistance, which has occurred on a series-compensated power transmission line according to claim 1, wherein, if the fault occurred between the series capacitors and station A, calculating an actual distance to fault and the fault resistance based on a calculating algorithm which comprises the equations $$E_A - E_B = [Z_A + Z_B + Z_L + Z_{SC\_pre}]I_{A\_pre} \quad (1)$$

$$E_A - E_B = [Z_A + x_1 Z_L + Z_{SC\_post}]I_{A\_post} - [(1-x_1)Z_L + Z_B]I_{B\_post} \quad (2)$$

$$V_{A\_post} - V_f = (x_1 Z_L + Z_{SC\_post})I_{A\_post}$$

$$I_f = I_{A\_post} + I_{B\_post}$$

where quantities with an index "pre" relate to the value prevailing before a fault has occurred and where quantities with an index "post" relate to the value prevailing immediately after the fault has occurred, and where equation (1) is a vectorial equation of a power transmission line corresponding to the conditions immediately before the fault has occurred, and where equation (2) is a vectorial equation of the power transmission line corresponding to the conditions immediately after the fault has occurred, and where $V_A$ represents voltage measured in station A, and where $V_f$ relates to the voltage on the power transmission line where the fault has occurred and which is determined with the aid of $$I_f = K_f V_f / R_f$$

where $I_f$ is the fault current through the fault resistance, and where $x_1$ is an unknown distance to fault from the power transmission line to the fault.

9. A method for location of a fault, and determination of the resultant fault resistance, which has occurred on a series-compensated power transmission line according to claim 8, wherein, if the fault occurred between station A and the series capacitors, the calculation of the actual distance to fault and the fault resistance is based on a calculating algorithm which comprises the equations $$E_A - E_B[Z_A + Z_B + Z_L + Z_{SC\_pre}]I_{A\_pre}; \quad (1)$$

$$E_A - E_B[Z_A + x_2 Z_L]I_{A\_post} - [(1-x_2)Z_L + Z_B + Z_{SC\_post}]I_{B\_post}; \quad (3)$$

$$V_{A\_post} - V_f = x_2 Z_L I_{A\_post};$$

and $$I_f = I_{A\_post} + I_{B\_post};$$

where quantities with an index "pre" relate to the value prevailing before a fault has occurred and where quantities with an index "post" relate to the value prevailing immediately after the fault has occurred, and where equation (1) is a vectorial equation of a power transmission line corresponding to a conditions immediately before the fault has occurred, and where equation (2) is a vectorial equation of the power transmission line corresponding to the conditions immediately after the fault has occurred, and where $V_A$ represents a voltage measured in station A, and where $V_f$ relates to a voltage on the power transmission line where the fault has occurred and which is determined with the aid of $$I_f = K_f V_f / R_f \quad (4)$$

where $I_f$ relates to the fault current through the fault resistance, and where $x_2$ designates an unknown distance to fault from the end point A of the power transmission line to the site of the fault.

10. A device for carrying out the method for location of a fault, and determination of the resultant fault resistance, which has occurred on a series-compensated power transmission line between two stations A and B according to claim 1, wherein the device comprises measuring devices for continuous measurement of phase currents and phase voltages in one of the stations (A), measurement converters for filtering and storage of a number of these consecutively measured values, a calculating unit provided with the calculating algorithms of the method, including iteration possibilities, arranged for receiving signals in the form of measured, filtered and stored pre-fault phase currents and phase voltages as well as measured and filtered values of post-fault phase currents and phase voltages as well as signals indicating the emf ($E_A$, $E_B$) and impedance ($Z_A$, $Z_B$) of the backward and forward power network, the length (L) and impedance ($Z_L$) of the power transmission line, and the distance (d) from station A to the series capacitors, assumed values of the distance to fault (x) and the fault resistance ($R_f$), data for deterring the type of fault ($K_f$) and, pre-determined maximally permissible difference values ($S_1$, $S_2$, $S_3$).

11. A method for location of a fault, and determination of the resultant fault resistance, which has occurred on a power transmission line which is series-compensated with capacitors, with a parallel-connected overvoltage protection device, between two stations (A) and (B), wherein the distance to the fault from one station (A) and the fault resistance are determined by means of values measured in said station (A) of voltage before (pre) and voltage and current after (post) the occurrence of the fault, wherein, if the fault occurred between station A and the series capacitors, the distance to the fault is determined by the steps of:

solving the expression:

$$x_{21} = \frac{Im(\underline{b}_2) - \sqrt{Im(\underline{b}_2)Im(\underline{b}_2) - 4Im(\underline{a}_2)Im(\underline{c}_2)}}{2Im(\underline{a}_2)}$$

which represents a second distance-to-fault equation $$a_2 x_2^2 - b_2 x_2 + c_2 - R_{f2} = 0$$

for $a_2$, $b_2$ and $c_2$, where $a_2$, $b_2$ and $c_2$ designate complex coefficients and $x_2$ represents the distance to the fault; and employing a second auxiliary vector $$D_2 = (Z_A + Z_B + Z_L)(I_{A\_post} - I_{A\_pre}) + Z_{SC\_post}I_{A\_post} - Z_{SC\_pre}I_{A\_pre}$$

Or where $Z_A$ is a source impedance of a backward power network;

$Z_B$ is a source impedance of a forward power network;

$Z_L$ is an impedance of a power transmission line;

Index, Post identifies a value after the occurrence of a fault;

Index, Pre identifies a value before the occurrence of the fault;

$I_A$ is a fault current;

$Z_S$ is a complex impedance; and $D_2^T$, which designates the transpose matrix of $D_2$, calculating the coefficients $a_2$, $b_2$ and $c_2$ as follows:

$$\underline{a}_2 = \frac{D_2^T}{D_2^T D_2} Z_L K_f Z_L I_{A\_post}$$

$$\underline{b}_2 = \frac{D_2^T}{D_2^T D_2}(Z_L K_f V_{A\_post} + [Z_L + Z_{SC\_post} + Z_B]K_f Z_L I_{A\_post})$$

$$\underline{c}_2 = \frac{D_2^T}{D_2^T D_2}(Z_L + Z_B + Z_{SC\_post})K_f V_{A\_post}$$

and where $Im(a_2)$, $Im(b_2)$ and $Im(c_2)$ are an imaginary part of the complex coefficients $\underline{a}_2$, $\underline{b}_2$ and $\underline{c}_2$, and the fault resistance equals $$R_{f2} = Re(\underline{a}_2)x_{21}^2 - Re(\underline{b}_2)x_{21} + Re(\underline{c}_2)$$

where $Re(a_2)$, $Re(b_2)$ and $Re(c_2)$ are a real part of the complex coefficients $a_2$, $b_2$ and $c_2$.

12. A method for determining which of a located fault according to claim 2 represents the true location, wherein, if the located fault is a three-phase fault, determining whether $R_{f1}$ is greater than $R_{f2}$, and if no, it is assumed, as a first assumption, that the fault is an $R_{f2}$ fault, and determining whether $R_{f2} > R_0$ where $R_0$ is a preset minimum value, and if so, the distance to fault is $x_{21}$, and if not, the distance to fault is $x_{11}$ and that if $R_{f1}$ is smaller than $R_{f2}$, it is assumed, as a first assumption, that the fault is an $R_{f1}$ fault, and determining whether $R_{f1}>R_0$ and if so, the distance to fault is $x_1$, and if not, the distance to fault is $x_2$ if the located fault is an unsymmetrical fault, the phase currents through the fault resistance are first determined for a fault according to claim 1 according to $$i_{f(R,S,T)1}=i_{A(R,S,T)}+i_{B(R,S,T)1} \qquad (25)$$

where $i_{A(R,S,T)}$ are the phase currents measured in station A $i_{B(R,S,T)1}$ is determined by means of equation (2) ($i_B=I_{B\text{-}post}$)

and for a fault according to $$i_{f(R,S,T)2}=i_{A(R,S,T)}+i_{B(R,S,T)2}$$

where $i_{B(R,S,T)2}$ is determined by means of equation (3) ($i_B=I_{B\text{-}post}$)

whereupon determining whether $i_{f1}$ is greater than $i_{f2}$, and if so, it is assumed, as a first assumption, that the fault is an $R_{f2}$ fault, and determining whether $R_{f2}>R_0$ where $R_0$ is a preset minimum value, and if so, the distance to fault is $x_{21}$, and if not, the distance to fault is $x_{11}$ and if $i_{f1}$ is smaller than $i_{f2}$, it is assumed, as a first assumption, that the fault is an $R_{f1}$ fault, and determining whether $R_{f1}>R_0$, and if so, the distance to fault is $x_1$, and if not, the distance to fault is $x_2$.

\* \* \* \* \*